United States Patent
Stojetz et al.

(10) Patent No.: US 11,923,660 B2
(45) Date of Patent: Mar. 5, 2024

(54) OPTOELECTRONIC SEMICONDUCTOR COMPONENT

(71) Applicant: OSRAM OLED GmbH, Regensburg (DE)

(72) Inventors: Bernhard Stojetz, Wiesent (DE); Christoph Eichler, Donaustauf (DE); Alfred Lell, Maxhütte-Haidhof (DE); Sven Gerhard, Alteglofsheim (DE)

(73) Assignee: OSRAM OLED GMBH, Regensburg (DE)

( * ) Notice: Subject to any disclaimer, the term of this patent is extended or adjusted under 35 U.S.C. 154(b) by 663 days.

(21) Appl. No.: 16/973,452

(22) PCT Filed: Jun. 6, 2019

(86) PCT No.: PCT/EP2019/064865
§ 371 (c)(1),
(2) Date: Dec. 9, 2020

(87) PCT Pub. No.: WO2019/238538
PCT Pub. Date: Dec. 19, 2019

(65) Prior Publication Data
US 2021/0249843 A1    Aug. 12, 2021

(30) Foreign Application Priority Data
Jun. 11, 2018 (DE) .................. 10 2018 113 874.1

(51) Int. Cl.
*H01S 5/183* (2006.01)
*H01S 5/04* (2006.01)
*H01S 5/40* (2006.01)

(52) U.S. Cl.
CPC .......... *H01S 5/18308* (2013.01); *H01S 5/041* (2013.01); *H01S 5/18361* (2013.01); *H01S 5/4093* (2013.01); *H01S 2301/176* (2013.01)

(58) Field of Classification Search
CPC ................... H01S 5/4093; H01S 5/40
(Continued)

(56) References Cited

U.S. PATENT DOCUMENTS 7,826,511 B1  11/2010 Yap et al.
2003/0058911 A1* 3/2003 Ebeling ................. H01S 5/426
                                                        372/50.1
(Continued)

FOREIGN PATENT DOCUMENTS

EP  1670104 A1  6/2006

*Primary Examiner* — Tuan N Nguyen
(74) *Attorney, Agent, or Firm* — MH2 TECHNOLOGY LAW GROUP LLP

(57) ABSTRACT

An optoelectronic semiconductor component is provided that includes a primary light source and a secondary light source. The primary light source and the secondary light source are monolithically integrated in the semiconductor component so that only condensed matter is located between them. The primary light source includes a first resonator containing a semiconductor layer sequence which is electrically pumped during operation. A first resonator axis of the first resonator is oriented parallel to a growth direction (G) of the semiconductor layer sequence. The primary light source is configured to generate pump laser radiation (P). The secondary light source includes a pump medium for generating secondary radiation (S) and the pump medium is optically pumped by the pump laser radiation (P). The first resonator axis points past the pump medium.

20 Claims, 11 Drawing Sheets

(58) Field of Classification Search
USPC .................................................. 372/50.124
See application file for complete search history.

(56) References Cited

U.S. PATENT DOCUMENTS

| | | |
|---|---|---|
| 2004/0012845 A1 | 1/2004 | Wang |
| 2004/0109485 A1 | 6/2004 | Flory et al. |
| 2005/0226302 A1 | 10/2005 | Lutgen |
| 2012/0019902 A1 | 1/2012 | Williams et al. |
| 2015/0092802 A1* | 4/2015 | Gronenborn ........... G02B 17/06 372/75 |
| 2016/0322782 A1 | 11/2016 | Farrell et al. |

* cited by examiner

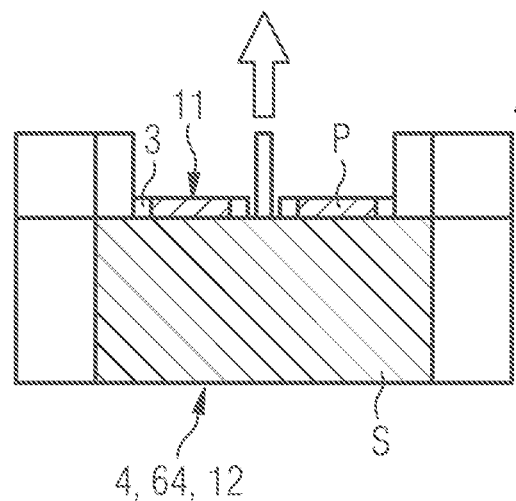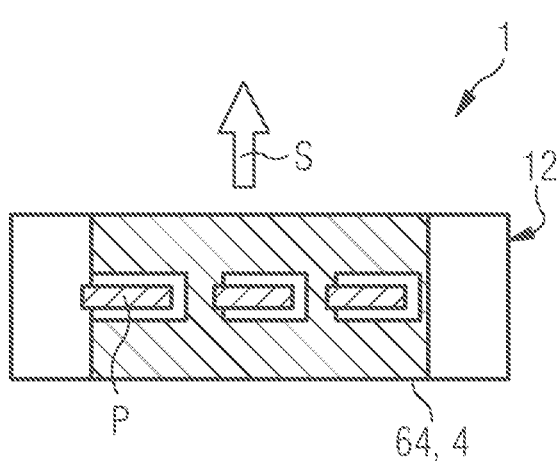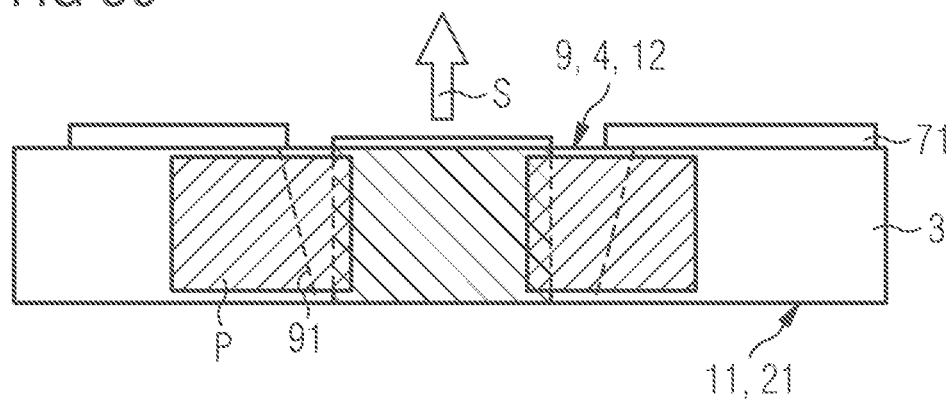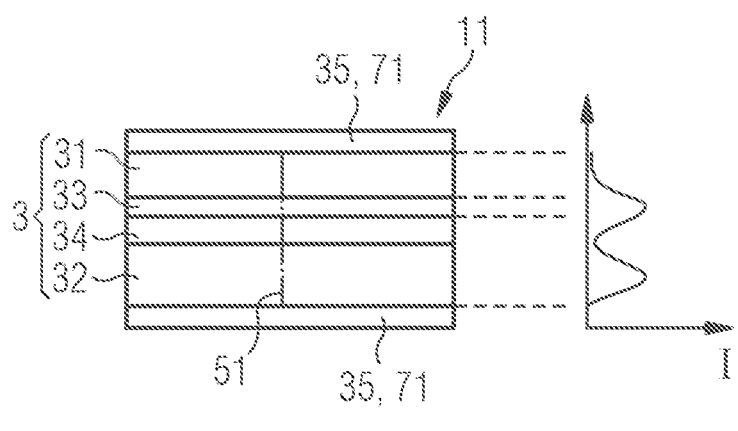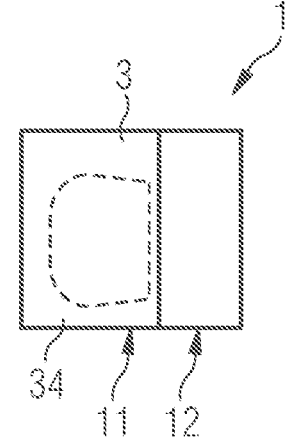

OPTOELECTRONIC SEMICONDUCTOR COMPONENT

CROSS-REFERENCE TO RELATED APPLICATIONS

This patent application is a national stage entry from International Application No. PCT/EP2019/064865, filed on Jun. 6, 2019, published as International Publication No. WO 2019/238538 A1 on Dec. 12, 2019, and claims priority under 35 U.S.C. § 119 from German patent application 10 2018 113 874.1, filed Jun. 11, 2018, the entire contents of all of which are incorporated by reference herein.

An optoelectronic semiconductor component is specified.

One task to be solved is to specify an optoelectronic semiconductor component that emits radiation with a high beam quality independent of power.

This task is solved among other things by an optoelectronic semiconductor component with the features of claim 1. Preferred further developments are subject of the other claims.

According to at least one embodiment, the optoelectronic semiconductor component comprises a primary light source and a secondary light source. In the primary light source, radiation is generated by means of electroluminescence. Radiation generation in the secondary light source is based on photoluminescence. The secondary light source is optically pumped by the electrically driven primary light source.

According to at least one embodiment the primary light source and the secondary light source are monolithically integrated in the semiconductor component. This means in particular that there is only condensed matter between the primary light source and the secondary light source, preferably only solids. This means that there is no air gap and/or free beam path between the primary light source and the secondary light source.

No air gap and no free beam path means that a very small gap may be present here and in the following. However, the possibly existing gap is so thin that it is practically optically irrelevant for the radiation. A thickness of the possibly existing gap is smaller than a range of an evanescent field of the radiation in question. Thus, the gap, if any, has a width of at most the wavelength of the primary laser radiation $\lambda$, preferably at most $\lambda/2$, particularly preferably at most $\lambda/4$ or $\lambda/8$ and/or at most 1 µm, preferably at most 0.5 µm, particularly preferably at most 250.

According to at least one embodiment, the primary light source and the secondary light source are directly attached to each other. This means in particular that modes of light fields of the primary light source and the secondary light source overlap, in particular evanescent fields. For example, a distance between the primary light source and the secondary light source is at most 5 µm or 2 µm or 1 µm. This means that the distance between the primary light source and the secondary light source is preferably less than 10 times a vacuum wavelength of the radiation generated by the secondary light source, especially at a maximum of 5 times or twice the vacuum wavelength.

According to at least one embodiment, the primary light source comprises a first resonator. The first resonator contains a semiconductor layer sequence which is electrically pumped during operation of the semiconductor component. The resonator comprises a resonator axis which is oriented parallel or approximately parallel to a growth direction of the semiconductor layer sequence. The primary light source is configured to generate a pump laser radiation.

In other words, the primary light source is preferably a laser diode with a vertically arranged resonator, also called Vertical Cavity Surface Emitting Laser or VCSEL for short. However, unlike a conventional VCSEL, the primary light source described here is not configured to emit radiation in a direction parallel to the growth direction.

According to at least one embodiment, the secondary light source comprises one or more pump media for generation of a secondary radiation. The at least one pump medium is optically pumped by the pump laser radiation of the primary light source. Preferably, no electroluminescence occurs in the secondary light source during normal operation of the semiconductor component.

The secondary light source may be formed with a second resonator, for example as a VCSEL, an edge-emitting laser, a solid-state laser crystal or an active optical fiber. As an alternative to a second resonator, the secondary light source may also be resonator-free and be realized, for example, by a phosphor as pump medium and generate non-coherent radiation.

According to at least one embodiment, the first resonator axis of the first resonator of the primary light source points past the pump medium of the secondary light source. This means in particular that in the direction parallel to the first resonator axis no radiation or no significant radiation component of the pump laser radiation reaches the pump medium. The pump medium is pumped along an edge of the primary light source, i.e. along the resonator axis and not over resonator end surfaces of the first resonator. In particular, the pump medium is pumped via an evanescent field of the pump laser radiation and/or via pump laser radiation scattered in the first resonator.

In at least one embodiment, the optoelectronic semiconductor component comprises a primary light source and a secondary light source. The primary light source and the secondary light source are monolithically integrated in the semiconductor component so that there is only condensed matter or only a negligible gap between them. The primary light source comprises a first resonator containing a semiconductor layer sequence which is electrically pumped during operation. A first resonator axis of the first resonator is oriented parallel to a growth direction of the semiconductor layer sequence. The primary light source is configured to generate a pump laser radiation. The secondary light source comprises at least one pump medium for generating secondary radiation and the pump medium is optically pumped by the pump laser radiation. The first resonator axis points past the pump medium.

Laser diodes in projection applications and in many other fields of application require a beam quality that is as independent of current and power as possible in order to focus the laser with high efficiency. Otherwise, depending on the power of the laser, the image reproduction quality suffers.

In order to achieve higher optical output powers, wider resonator structures are usually used, but these often result in an inhomogeneous mode distribution, a so-called filamentation. On the one hand, this leads to a reduced beam quality and on the other hand to so-called hot spots on a laser facet, which is associated with an increased risk of facet damage. Therefore, conventional laser diodes, which have to meet high requirements regarding beam quality, are limited in their optical power. Conversely, laser diodes with high optical power generally have an insufficient beam quality.

In the semiconductor component described here, the primary light source can be operated at high power. The primary light source does not have to have high beam quality, since no radiation is emitted directly from the primary light source. The radiation generated in the primary light source is converted in the secondary light source so that only the secondary light source needs to emit radiation with a high beam quality. The secondary light source can be seen as an integrated element for beam enhancement.

Index-guided or gain-guided laser structures are characterized in particular by the fact that the optical mode is guided in a direction transverse to a growth direction of a semiconductor material by a refractive index jump between a ridge waveguide, also called stripe or ridge, and a deeper etched region at the side of the ridge waveguide. If inhomogeneities in the horizontal waveguide along the ridge waveguide occur due to process variations, light is leaving from the resonator. This scattered light propagates in the semiconductor chip lateral to the ridge waveguide and, after being coupled out via a facet of the laser chip, interferes with the mode guided in the ridge waveguide, which leads to disturbances in the optical far field.

Alternatively, diode-pumped solid-state lasers require a comparatively large amount of space, since the individual components are arranged behind or next to each other. In addition, further optical components are required to image a pump laser beam onto the solid-state laser crystal, to set up the resonator for the solid-state laser beam, and to decouple the solid-state laser beam. The technical implementation is achieved by a relatively complex combination of individual components that are adjusted to each other. Due to the high space requirement and the complex, costly assembly, this approach is unsuitable for many applications.

With the semiconductor component described here, a compact design with simultaneously high beam quality over a wide power range is possible. For example, instead of a solid state laser crystal, the secondary light source integrated in a VCSEL laser diode is used to improve the beam quality. Preferably, a second resonator of the secondary light source is located directly adjacent to the VCSEL, formed by the primary light source. The VCSEL or VCSELs pump the pump medium of the second resonator. For this purpose, the pump laser radiation is coupled out of the first VCSEL resonator and injected into the second resonator. The first resonator is preferably highly reflective on both sides.

In this configuration, materials can be optically pumped which themselves cannot be electrically pumped. For example, AlInGaN edge emitters configured for emission in the red or yellow spectral range can be used, since these can be designed without a p-side in the case of optical pumping; instead, cladding layers of silicon dioxide, for example, can be used. In addition, VCSEL RGB arrays can be constructed; thus, VCSELs can easily be made of the same materials of the same color and phosphors or converter materials can be subsequently applied as desired.

By designing the primary light source as a VCSEL, a compact pump light source can be achieved, thus saving space. Furthermore, no refracted or split facets are required in the manufacturing process. A flexible pump light source that can be shaped in almost any way can be constructed.

Compared to a conventional, diode-pumped solid-state laser, the semiconductor component described here offers the following advantages in particular:

A compact design is given because of the monolithic integration of the primary light source and the secondary light source.

A high beam quality is achievable, largely independent of the power of the primary light source.

A significantly lowered laser threshold of the primary light source can be achieved.

An emission of the pump laser radiation can be suppressed.

An increased coupling of the pump laser radiation into the secondary light source can be achieved.

According to at least one embodiment, the pump laser radiation is only guided along the resonator axis. Resonator end faces of the first resonator are opaque to the pump laser radiation. Opaque means in particular that the resonator end surfaces have a transmission capacity for the pump laser radiation of at most 1% 10% (?) or 3% or 1% or 0.1% or are completely opaque. Especially if the transmittance is comparatively high, a monitor diode can be integrated.

According to at least one embodiment, optical pumping of the pump medium is performed in a direction perpendicular to the first resonator axis, in particular only in a direction perpendicular to the first resonator axis or predominantly in this direction. Predominant means, for example, to a proportion of at least 80% or 90% or 95%. Pumping is preferably performed via the evanescent field of the pump laser radiation, which reaches into the pump medium of the secondary light source. Thus, it is possible to achieve that the pump laser radiation does not leave the semiconductor component or does not leave it essentially, i.e. only to a negligible extent. This means, for example, that the power share of the pump laser radiation in the total radiation leaving the semiconductor component is at most 10% or 1% or 0.1%.

According to at least one embodiment, the secondary light source comprises a second resonator. The pump medium is located in the second resonator. Thus the secondary radiation may be a laser radiation. A laser mode of the pump laser radiation preferably overlaps with a laser mode of the secondary radiation.

Alternatively, the secondary radiation is an incoherent radiation, which for example comes from at least one phosphor. This means that the secondary light source can be free of a resonator.

According to at least one embodiment, the second resonator comprises a second resonator axis. Within the second resonator, the secondary radiation is mainly guided parallel to the second resonator axis and along the second resonator axis.

According to at least one embodiment, the second resonator axis is parallel to the first resonator axis. This preferably applies with a tolerance of at most 20° or 10° or 5° or 1°.

According to at least one embodiment, the first resonator and the second resonator are jointly bounded by at least one Bragg mirror. This means that the first resonator and the second resonator are bounded along the first and the second resonator axis by the at least one Bragg mirror. The Bragg mirror is preferably highly reflective for the pump laser radiation and/or transparent for the secondary radiation. Highly reflective preferably means a reflectance of at least 95% or 98% or 99% or 99.5%. Transmissive means in particular a transmittance of at least 20% or 60% or 90%.

According to at least one embodiment, the common Bragg mirror at least one resonator end is the only resonator end mirror for both resonators. Thus, different resonator end mirrors can be avoided and the semiconductor component can be manufactured efficiently.

According to at least one embodiment, the second resonator axis is perpendicular to the first resonator axis. This preferably applies with a tolerance of at most 45° or 30° or 10° or 5° or 1°. In this case, the secondary light source is preferably designed as an edge-emitting laser.

According to at least one embodiment, the pump medium is arranged in an intensity maximum or at an intensity maximum of the pump laser radiation along the first resonator axis. In the first resonator, an intensity distribution along the first resonator axis may form, resulting in intensity nodes and intensity antinodes. The pump medium is preferably localized and/or concentrated in or at an intensity antinode.

According to at least one embodiment, the first resonator surrounds the pump medium on at least two sides. This is in particular true when the first resonator axis is viewed in plan view and parallel to the first resonator axis. This allows the pump medium to be optically pumped from several sides, especially via an evanescent field.

According to at least one embodiment, the pump medium is surrounded by the first resonator when viewed in plan view and parallel to the first resonator axis. In this case, a main radiation direction of the secondary radiation is preferably oriented parallel or approximately parallel to the first resonator axis, so that the secondary radiation does not need to pass through the semiconductor layer sequence of the first resonator.

According to at least one embodiment, a refractive index of the pump medium for the pump laser radiation is at least as large as a refractive index of the semiconductor layer sequence for the pump radiation. Preferably, the refractive indices of the pump medium and the semiconductor layer sequence are approximately the same for the pump radiation, in particular with a tolerance of at most 0.2 or 0.1 or 0.05. Thus, it can be achieved that the pump laser radiation in the pump medium behaves similar to a substrate mode in conventional lasers.

According to at least one embodiment, there is one or more connection layers between the primary light source and the secondary light source. For example, the at least one connection layer has a lower reflectivity for the pump laser radiation than for the secondary radiation. Therefore the connection layer may act as a dichroic mirror. Alternatively or additionally, a refractive index jump between the first resonator and the pump medium is divided by the connection layer into two or more smaller refractive index. The connection layer can be formed by a stack of layers, similar or equal to a Bragg mirror.

According to at least one embodiment, the pump medium is provided with a coating layer reflecting the secondary radiation in a direction transverse to a main emission direction of the secondary radiation, preferably on all sides facing away from the primary light source. It is possible that the pump medium is surrounded by the coating layer together with an optical coupling surface to the primary light source. This prevents secondary radiation from being emitted in unwanted directions. The coating may be a dielectric mirror and/or a reflective metal layer. The coating layer may also be reflective for pump laser radiation.

According to at least one embodiment, the semiconductor component comprises several of the primary light sources. The primary light sources are preferably configured to pump at least one secondary light source together. This means that one secondary light source may be optically pumped by several primary light sources. If there are several secondary light sources, each of the secondary light sources may be optically pumped by several of the primary light sources.

According to at least one embodiment, the primary light sources are stacked on top of each other. The primary light sources are preferably optically decoupled from each other in a direction parallel to the first resonator axes.

According to at least one embodiment the primary light sources are arranged side by side. This means that the primary light sources preferably do not overlap in plan view parallel to the first resonator axes. With such an arrangement, secondary light sources may be optically pumped in particular if their main emission direction is oriented transversely or perpendicular to the first resonator axis. It is also possible that the first resonator axes of the primary light sources are not all parallel to each other, but at least some of them are oriented obliquely to each other.

According to at least one embodiment, the semiconductor component comprises a plurality of secondary light sources which are commonly optically pumped by the one or one of the primary light sources during operation. There may be several groups of secondary light sources, wherein each group is optically pumped by a single primary light source.

According to at least one embodiment there is a plurality of primary light sources and a plurality of secondary light sources. The primary light sources or groups of primary light sources are electrically independently controllable. Between the primary light sources and the secondary light sources there is preferably a unique or bijective assignment.

According to at least one embodiment, the primary light sources and the secondary light sources are arranged in a regular field when viewed in plan view, for example in a hexagonal or rectangular grid.

According to at least one embodiment, the semiconductor component is a display device like a display. The display device may be monochrome or multicolored. Preferably, the display device comprises a plurality of pixels, each configured to emit red, green and blue light in an adjustable and independent manner. This means that the display device may be an RGB color display.

According to at least one embodiment, at least the red and green light is generated by the secondary light sources. It is possible that the blue light also is generated by the secondary light sources, in particular if the pump laser radiation is in the deep blue or near ultraviolet spectral range. If blue light is generated by the pump light source, the blue light may be emitted directly without a secondary light source being involved.

According to at least one embodiment, the pump medium is partially or completely integrated in a growth substrate of the semiconductor layer sequence. In this case, the pump medium may be a doping in a material such as sapphire, for example, so that the growth substrate acts as the pump medium of the secondary light source.

In the following, an optoelectronic semiconductor component described here is explained in more detail with reference to the drawing using exemplary embodiments. Identical reference signs indicate identical elements in the individual figures.

However, no scale references are shown. For better understanding, individual elements may be shown in exaggerated size.

In the figures:

FIG. 34 shows a schematic sectional view of an exemplary embodiment of an optoelectronic semiconductor component described here;

FIG. 35 shows a schematic top view of the exemplary embodiment of FIG. 34;

FIG. 36 shows a schematic sectional view of an exemplary embodiment of an optoelectronic semiconductor component described here; and FIGS. 37 to 39 show a schematic sectional view, a representation of an intensity distribution and a schematic plan view of a semiconductor layer sequence for an optoelectronic semiconductor component described here.

FIG. 1 shows a schematic plan view and FIG. 2 shows a schematic sectional view of an exemplary embodiment of an optoelectronic semiconductor component 1.

Figure 1:
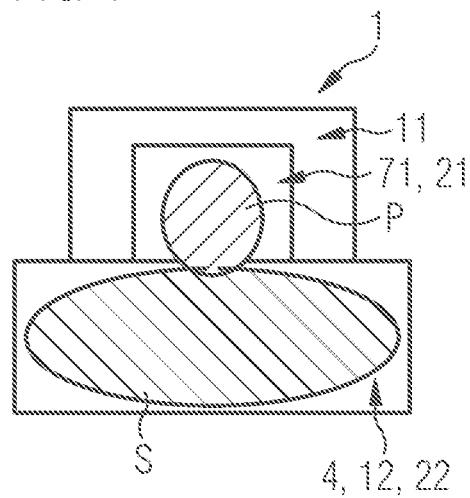
FIGS. 1, 3 and 5 show schematic plan views of exemplary embodiments of optoelectronic semiconductor components described here.

The semiconductor component 1 comprises a primary light source 11, which is a laser diode with a vertical resonator, VCSEL for short. In the primary light source 11 a pump laser radiation P is generated in a first resonator 21. The first resonator 21 is bounded along a first resonator axis 51 by two resonator mirrors 71 which are opaque to the pump laser radiation P. The first resonator 21 contains a semiconductor layer sequence 3, in which the pump laser radiation P is generated via electroluminescence. In the first resonator 21, the pump laser radiation P runs parallel to a growth direction G of the semiconductor layer sequence 3.

A secondary light source 12 is located directly at the primary light source 11. The secondary light source 12 can be an optically pumped VCSEL, so that the semiconductor layer sequence 3 optionally extends continuously over the two light sources 11, 12. The pump laser radiation P propagates in a direction perpendicular to the resonator mirrors 71 and couples preferably via an evanescent field or via scattered radiation into a pump medium 4 of the secondary light source 12.

Preferably, the secondary light source 12 has a second resonator 22, which contains the pump medium 4, for example a semiconductor layer sequence. Such a semiconductor layer sequence may have a different quantum well structure for the primary light source 11 than for the secondary light source 12.

The second resonator 22 is closed by a reflecting resonator mirror 72 and an outcoupling coating 73. A secondary radiation S generated in the secondary light source 12 exits the semiconductor component 1 through the outcoupling coating 73. The pump laser radiation P is not emitted.

Therefore, the secondary radiation S may be a laser radiation. An overlapping of modes of the two laser radiations P, S is schematically illustrated in the figures by overlapping hatching. The figures show the modes of the laser beams P, S only in a simplified way. The secondary radiation S has a longer wavelength than the pump laser radiation P.

Electrodes for supplying the semiconductor layer sequence 3 with current are not shown in FIG. 1 to simplify the representation. Metallic contacts or electrodes are preferably flat, since the pump laser radiation P is not emitted through openings of the electrodes.

A refractive index of the pump medium 4, if it is not formed by the semiconductor layer sequence 3, is preferably at least as high as the refractive index of the semiconductor layer sequence 3. Preferably, the pump medium 4 and the semiconductor layer sequence 3 have similar refractive indices.

Figure 3:
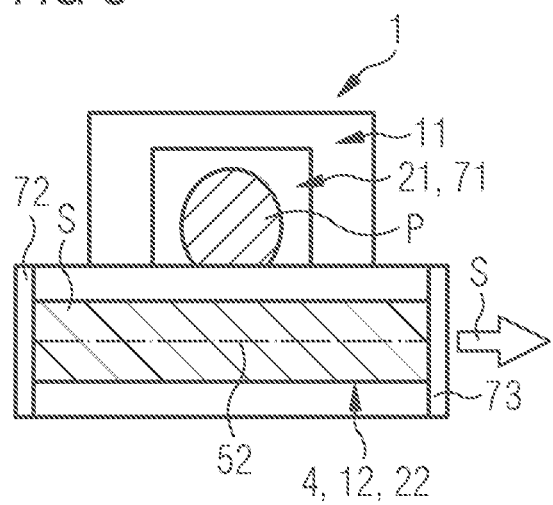
Figure 4:
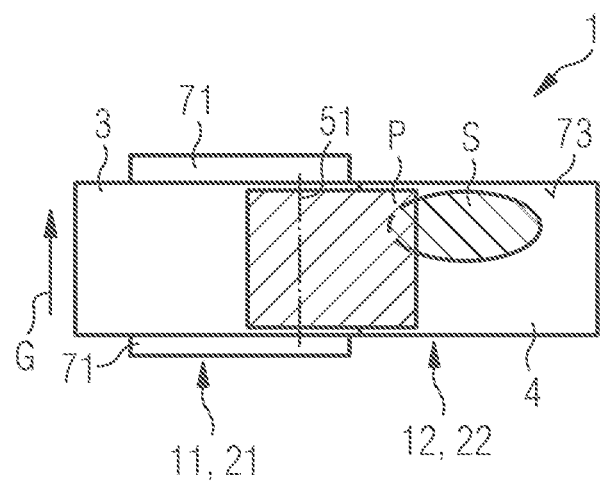

The exemplary embodiment of FIG. 3 shows that resonator axes 51, 52 of the first resonator 21 and the second resonator 22 are oriented perpendicular to each other. In FIG. 3, the pump laser radiation P in the first resonator 21 is directed perpendicular to the drawing plane and the secondary radiation S is directed parallel to the drawing plane; FIG. 4 shows the corresponding plan view. Thus the resonator end coatings 72, 73 of the secondary light source 12 are oriented perpendicular to the resonator mirrors 71 of the primary light source 11.

Figure 5:
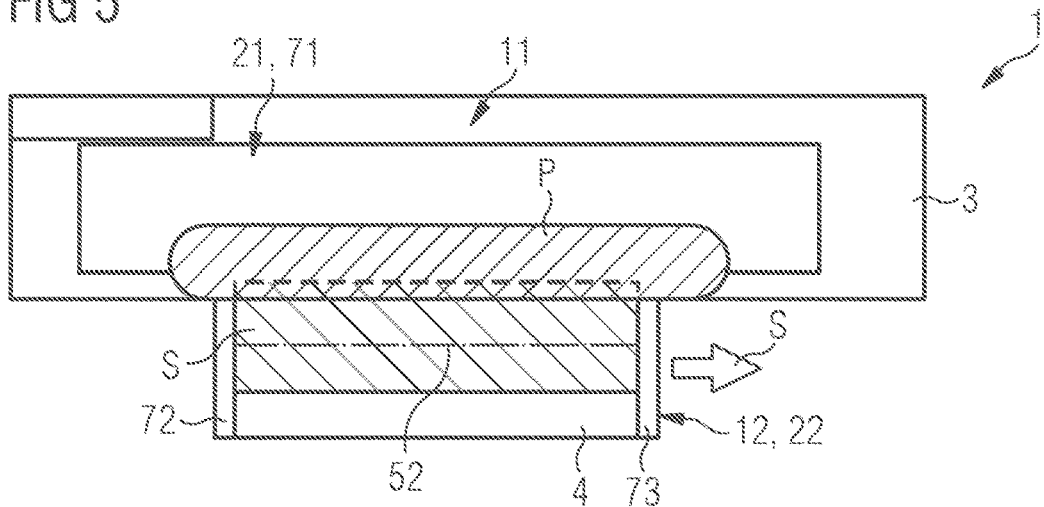
Figure 6:
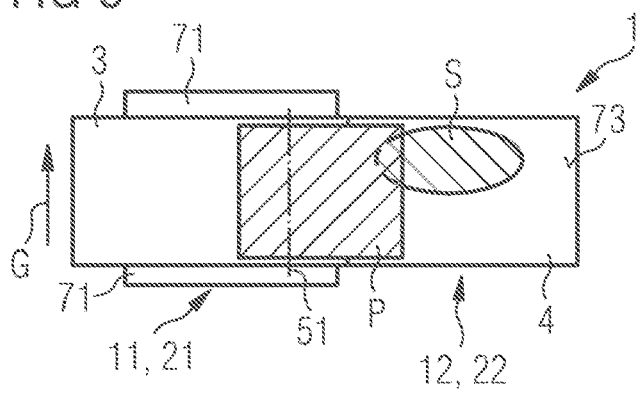

In the exemplary embodiment of FIGS. 5 and 6 it is shown that the mode of the pump laser radiation P and thus the shape of the first resonator 21 may be adjusted to achieve optimum pumping of the pump medium 4. Thus, a mode of the pump laser radiation P seen in plan view, see FIG. 5, is elongated and oriented parallel to the second resonator axis 52. The pump laser radiation P can be generated in the primary light source 11 along the entire length of the second resonator axis 52. Electrodes for energizing the semiconductor layer sequence 3 in the region of the first resonator 21, not drawn, can be designed to coincide with the mode of the pump laser radiation P, as can the resonator mirrors 71.

Apart from that, the exemplary embodiment of FIGS. 5 and 6 corresponds to that of FIGS. 3 and 4.

Figure 7:
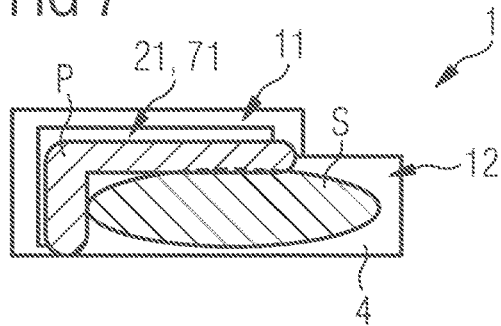
FIGS. 7 to 12 show schematic plan views of exemplary embodiments of optoelectronic semiconductor components described here.
Figure 8:
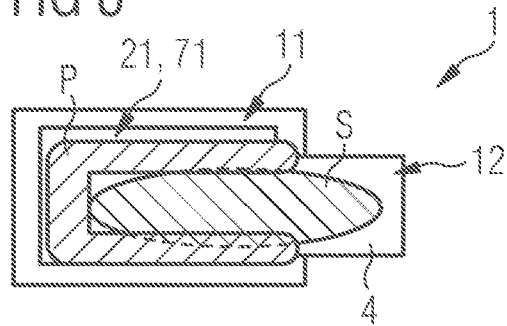
Figure 9:
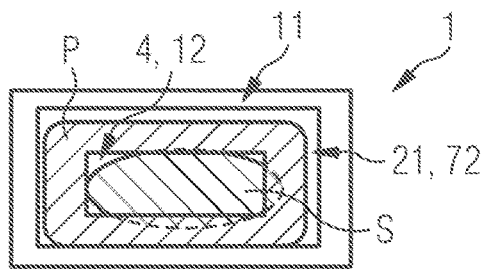

FIGS. 7 to 9 show further examples of the mode of pump laser radiation P in plan view. The resonator axes 51, 52 in FIGS. 7 to 9 are perpendicular to the drawing plane. In FIGS. 7 and 8, however, they can also be aligned perpendicular to each other.

According to FIG. 7, the mode of the pump laser radiation P is arranged in an L-shape in plan view on two sides of the pump medium 4. According to FIG. 8, the mode of the pump laser radiation P is U-shaped and located on three sides of the pump medium 4. In FIG. 9, the mode of the pump laser radiation P encloses the pump medium 4 all around, as seen in plan view.

Figure 10:
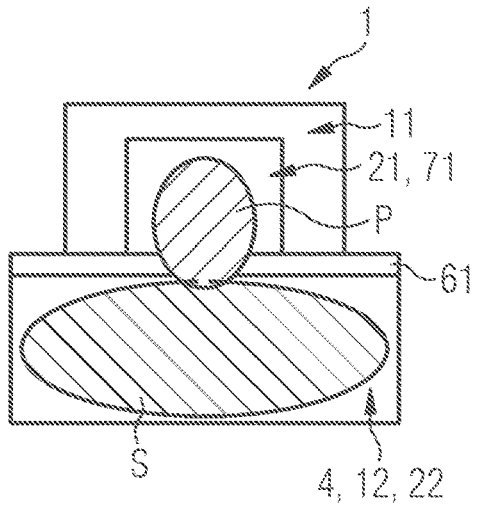

FIG. 10 shows that there is an optical connection layer 61 between the primary light source 11 and the secondary light source 12. The connection layer 61 is, for example, made of a dielectric material or of a transparent conductive oxide such as ITO. By using connection layer 61, an air gap and/or a large refractive index jump between the light sources 11, 12 can be avoided or at least reduced.

Figure 11:
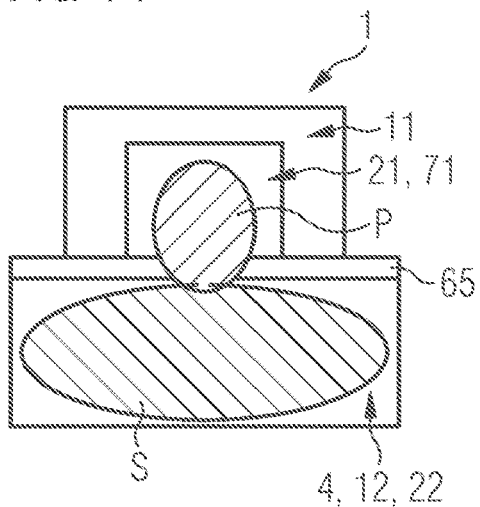

FIG. 11 shows that there is a dichroic coating 65 between the light sources 11, 12. This allows the pump laser radiation P to enter the secondary light source 12. Penetration of the secondary light radiation S into the primary light source 12 is prevented or reduced. For example, the secondary radiation S is guided in the second resonator 22 via total internal reflection. Thus, the second resonator 22 can be defined in lateral direction, especially by means of the coating 65.

For example, in the case of a GaN laser diode on a sapphire crystal, such a coating 65 is advantageous because sapphire has a lower refractive index than GaN and therefore the light from the GaN crystal undergoes total reflection at the interface. In this case, the pump medium 4 would be integrated into the sapphire crystal.

In order to lose as little light as possible on the lateral surfaces of the optically pumped pump medium 4, it is preferably provided with a coating layer 62 on the side. The coating layer 62 is highly reflective at least for the pump laser radiation P, but can also be reflective for the secondary radiation S. For example, the coating layer 62 is a dielectric Bragg mirror and/or a metal layer. The coating layer 62 increases the coupling efficiency of the pump laser radiation P into the pump medium 4. The pump medium 4 is preferably surrounded by the coating layer 62 together with the primary light source 11.

Figure 12:
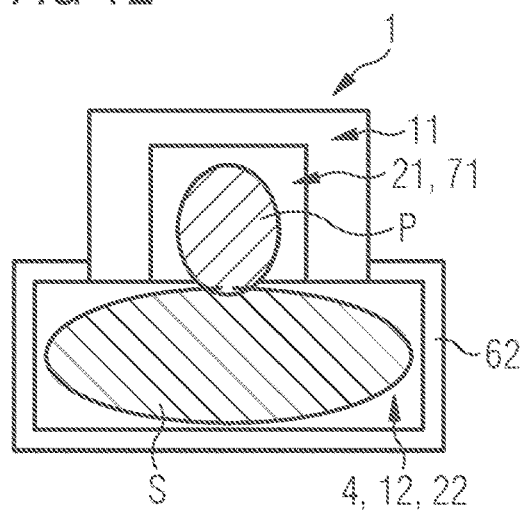

Such layers 61, 62, 65, as shown in FIGS. 10 to 12, may also be present in all other exemplary embodiments.

Figure 13:
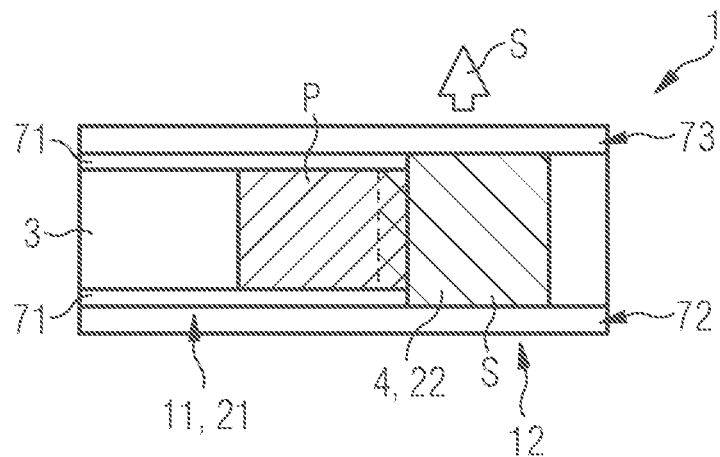
FIGS. 13, 14 and 16 show schematic sectional views of exemplary embodiments of optoelectronic semiconductor components described here.
Figure 14:
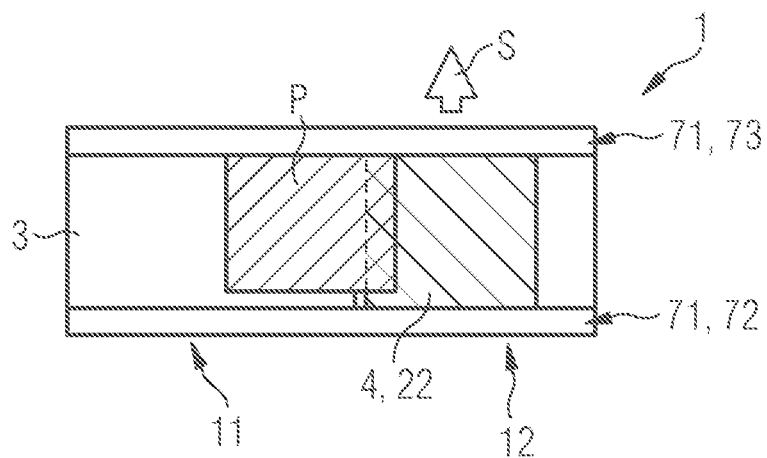

The exemplary embodiment in FIG. 13 shows that the coatings 72, 73, which terminate the second resonator 22, are also applied to the primary light source 11 in a continuous manner. FIG. 14 shows that the resonator mirrors 71 of the primary light source 11 are omitted.

Figure 15:
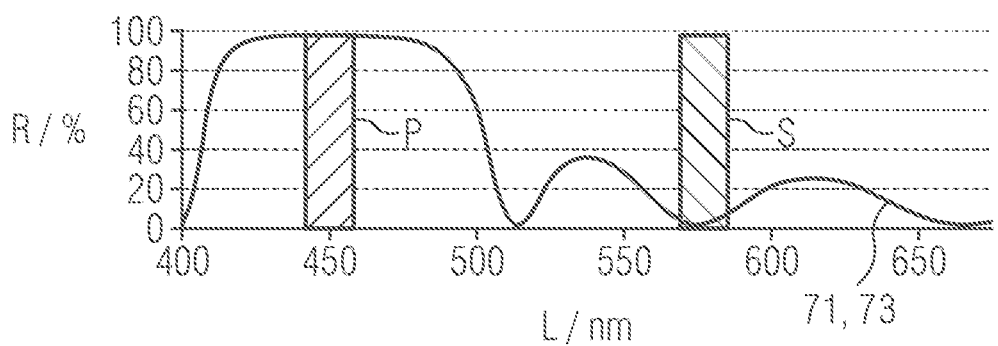
FIGS. 15 and 17 show schematic representations of optical properties of Bragg mirrors for the exemplary embodiments of FIGS. 13, 14 and 16.

A reflectivity R in percent versus a wavelength L in nanometers of a suitable Bragg mirror for the coatings 71, 73 of FIGS. 13 and 14 is illustrated in FIG. 15. With such a Bragg mirror, for example, a high reflectivity of almost 100% can be realized at the wavelength of pump laser radiation P, in particular blue light at about 450 nm. In contrast, the wavelength of secondary radiation S, for example orange light at about 575 nm, has a low reflectivity R.

Such Bragg mirrors can also be designed accordingly for other wavelength pairs of the radiation P, S.

Figure 16:
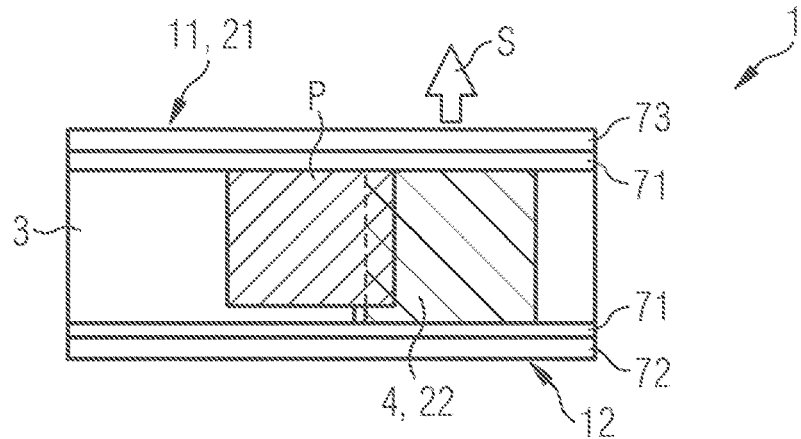

FIG. 16 illustrates that both the resonator mirror 71 of the first resonator 21 and the resonator end coatings 72, 73 of the second resonator 72 are designed as continuous layers.

Figure 17:
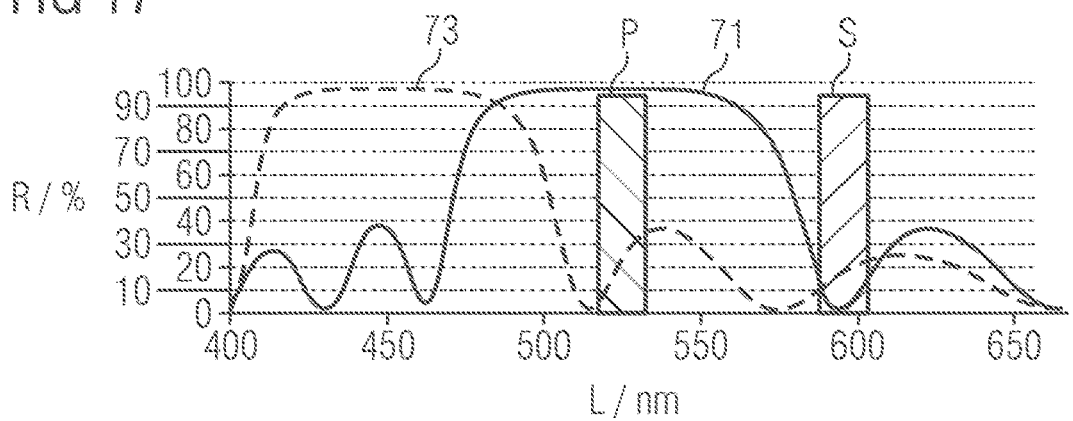

The reflectivity R of exemplary Bragg mirrors for the coatings 71, 73 of FIG. 16 is illustrated in FIG. 17. In this example, the primary radiation P has a wavelength of approximately 525 nm in the green spectral range. The secondary radiation S has a wavelength of about 595 nm in the red spectral range. Thus, a high transmission for the secondary radiation S can be achieved with a high reflectivity for the pump laser radiation P. Preferably, the coatings 72, 73 are located on the outside of the resonator mirrors 71 of the first resonator 21.

The second coating 72 on an underside of the second resonator 22 is preferably highly reflective for the secondary radiation S. FIG. 17 does not illustrate the coating 72 on the underside.

With a suitable reflectivity of the outcoupling coating 73, a gain in the second resonator 22 can be adjusted so that the secondary radiation S is generated efficiently and at the same time a high light output efficiency is achieved.

Figure 2:
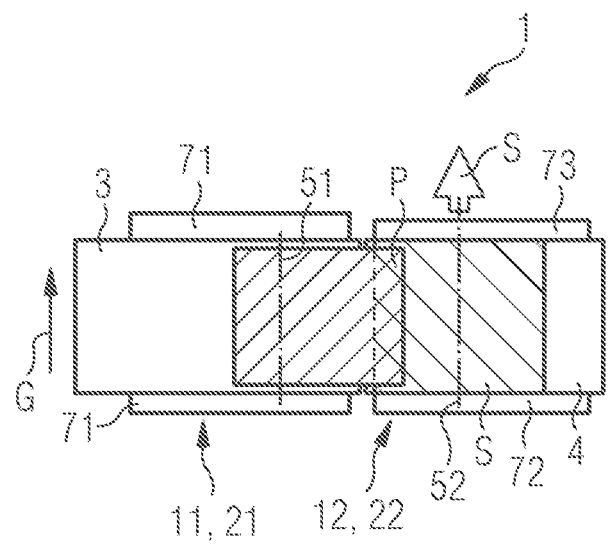
FIGS. 2, 4 and 6 show schematic sectional views of the exemplary embodiments of FIGS. 1, 3 and 5.
Figure 18:
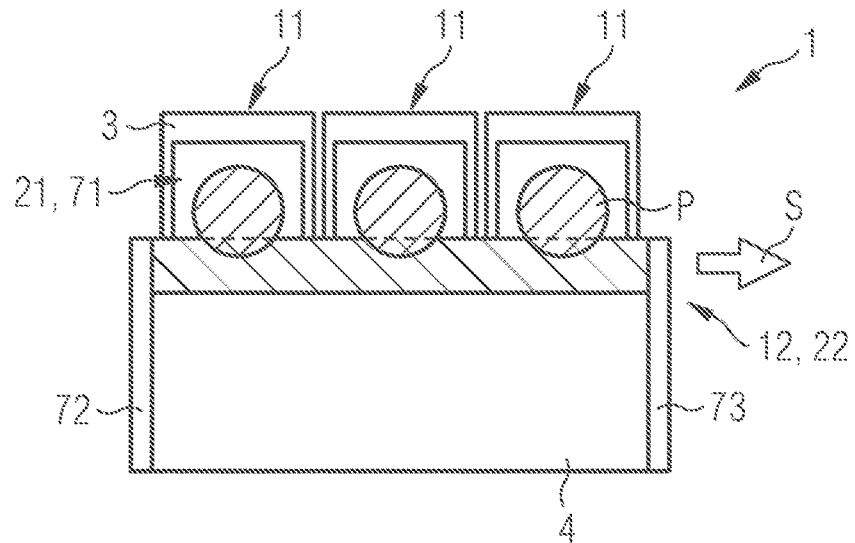
FIG. 18 shows a schematic plan view of an exemplary embodiment of an optoelectronic semiconductor component described here.

In the exemplary embodiment shown in FIG. 18, several of the primary light sources 11 are arranged at the secondary light source 12, which is designed as an edge emitter, for example. The first resonator axes 51 can be designed perpendicular to the second resonator axis 52. In all other respects, the exemplary embodiment in FIG. 18 corresponds to that in FIGS. 1 and 2.

The emission direction of the second resonator 22 does not have to be the same as that of the primary light source 11. A direction of emission of the secondary radiation S can be determined by selecting the reflections on the different sides of the second resonator 22. Thus, two VCSELs with different emission directions for the light sources 11, 12 can be arranged side by side. Likewise, a second resonator in edge emitter geometry can be used, with the primary light source 11 serving as a pump light source perpendicularly or arbitrarily to it, and can be attached to side surfaces of the edge emitter.

Preferably, a laser mode of the primary light source 11 is not circular, but elongated in plan view, so that the pump medium 4 can be pumped with a large overlap of the modes in case of an edge emitter. Furthermore, several primary light sources 11 can be arranged along side surfaces of the edge emitter in the shape of the secondary light source 12. A contacting, especially a p-contact of the secondary light source 12, is then preferably partially interrupted and/or transparent, for example made of ITO.

Figure 19:
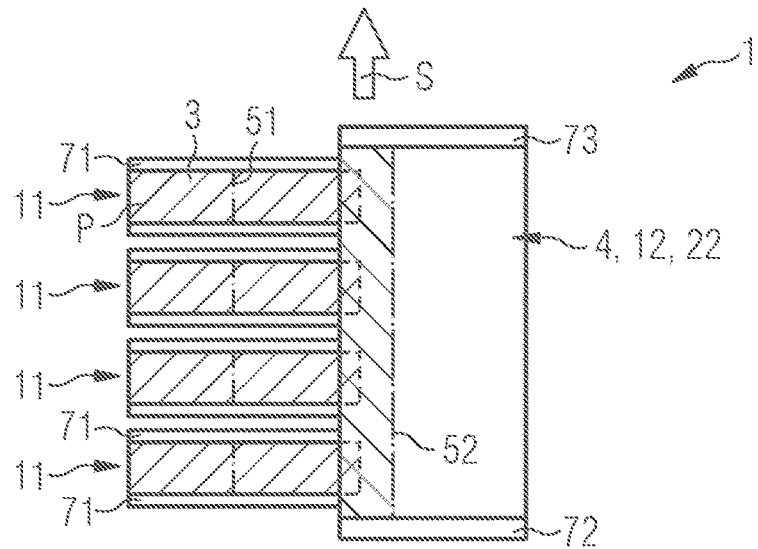
FIG. 19 shows a schematic sectional view of an exemplary embodiment of an optoelectronic semiconductor component described here.

FIG. 19 shows that several of the primary light sources 11 are stacked on top of each other along the second resonator axis 52. The primary light sources 11 can be mounted at a distance from each other or can be stacked directly on top of each other. It is also possible that the primary light sources 11 share one of the resonator mirrors 71, see the two lowest primary light sources 11 shown in FIG. 19.

In the exemplary embodiments of FIGS. 20 to 23, there are several of the primary light sources 11 which together optically pump the secondary light source 12. The primary light sources 11 can only be operated electrically together or can be controlled electrically independently.

Figure 20:
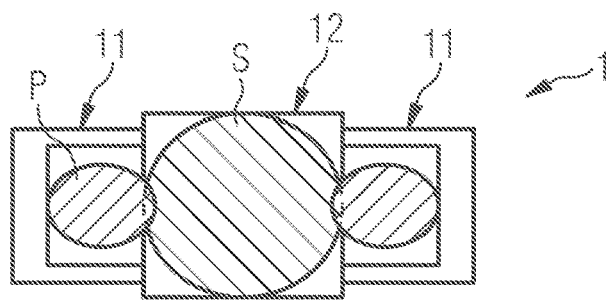
FIGS. 20 to 30 show schematic plan views of exemplary embodiments of optoelectronic semiconductor components described here.

According to FIG. 20, there is a linear arrangement of the light sources 11, 12, where the primary light sources 11 are located on two sides of the secondary light source 12.

Figure 21:
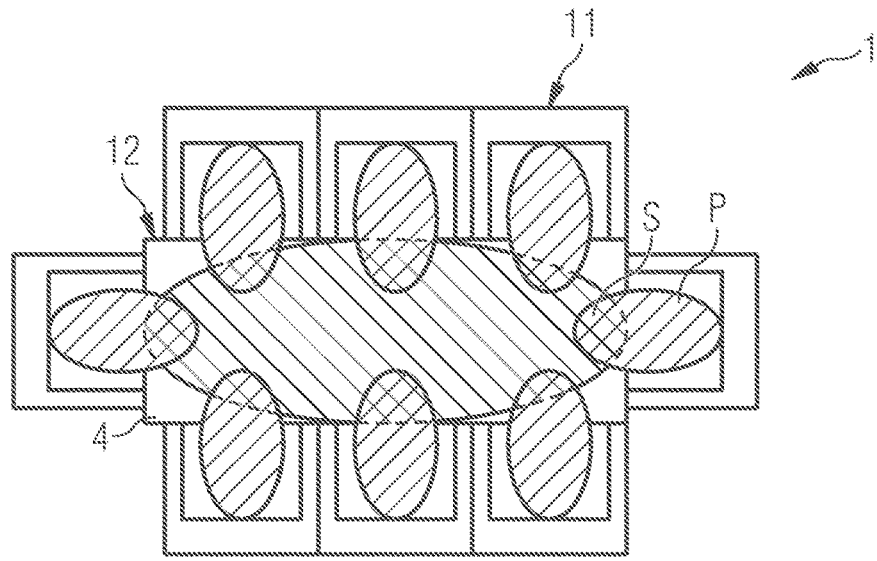

In the exemplary embodiment in FIG. 21, the primary light sources 11 are arranged on four sides around the pump medium 4. The mode of the secondary radiation S is elongated and several of the primary light sources 11 are located on one elongated side.

Figure 22:
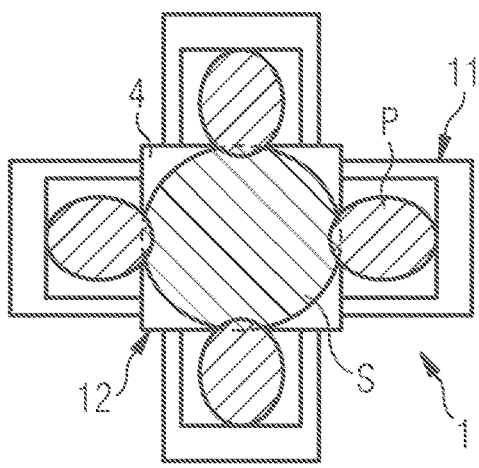

According to FIG. 22, a cross-shaped arrangement is realized. On each side of the pump medium 4 there is the same number of primary light sources 11, for example one of the primary light sources 11 on each side.

Figure 23:
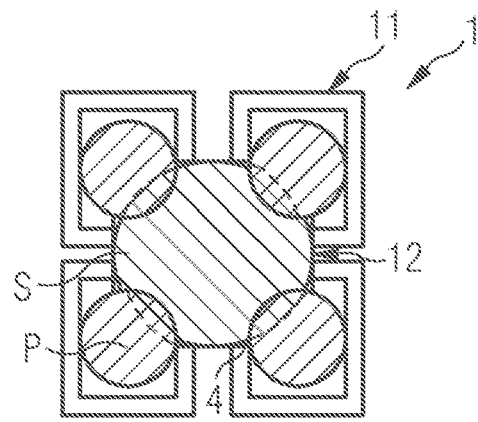

In FIG. 23, the primary light sources 11 are arranged in a square grid and surround the pump medium 4 along diagonals. This arrangement allows space-saving accommodation of the light sources 11, 12.

The number and arrangement of the primary light sources 11 around the secondary light source 12 depends on the design of the mode of the secondary radiation S. Accordingly, the arrangement of the primary light sources 11 has to be adapted to the shape of the mode of the secondary radiation S, as shown in FIG. 21.

Figure 24:
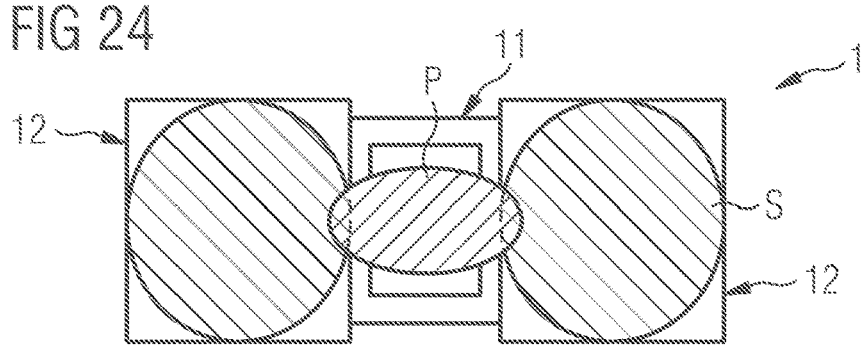
Figure 25:
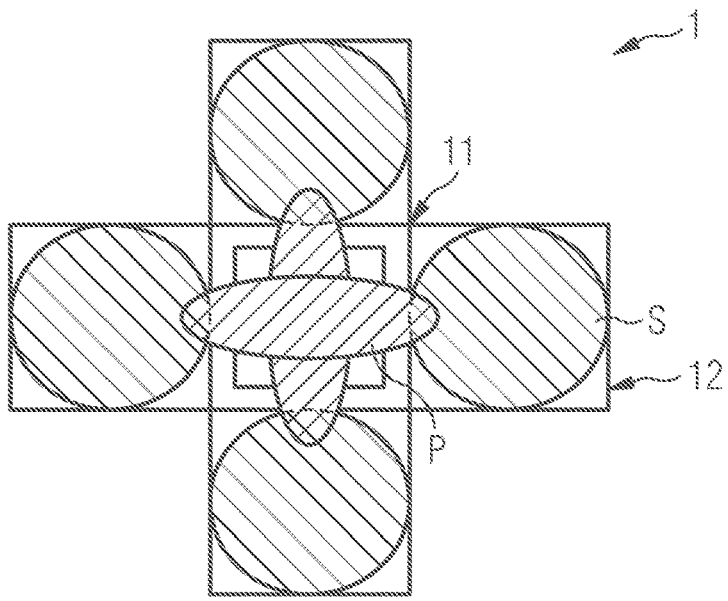

FIGS. 24 and 25 each show a primary light source 11 which optically pumps several of the secondary light sources 12. This can be designed as a linear arrangement, see FIG. 24, or as a cross-shaped arrangement, see FIG. 25. The mode of the pump laser radiation P is preferably adapted to the arrangement and shape of the secondary light sources 12, analogous to the exemplary embodiments of FIGS. 20 to 23.

Figure 26:
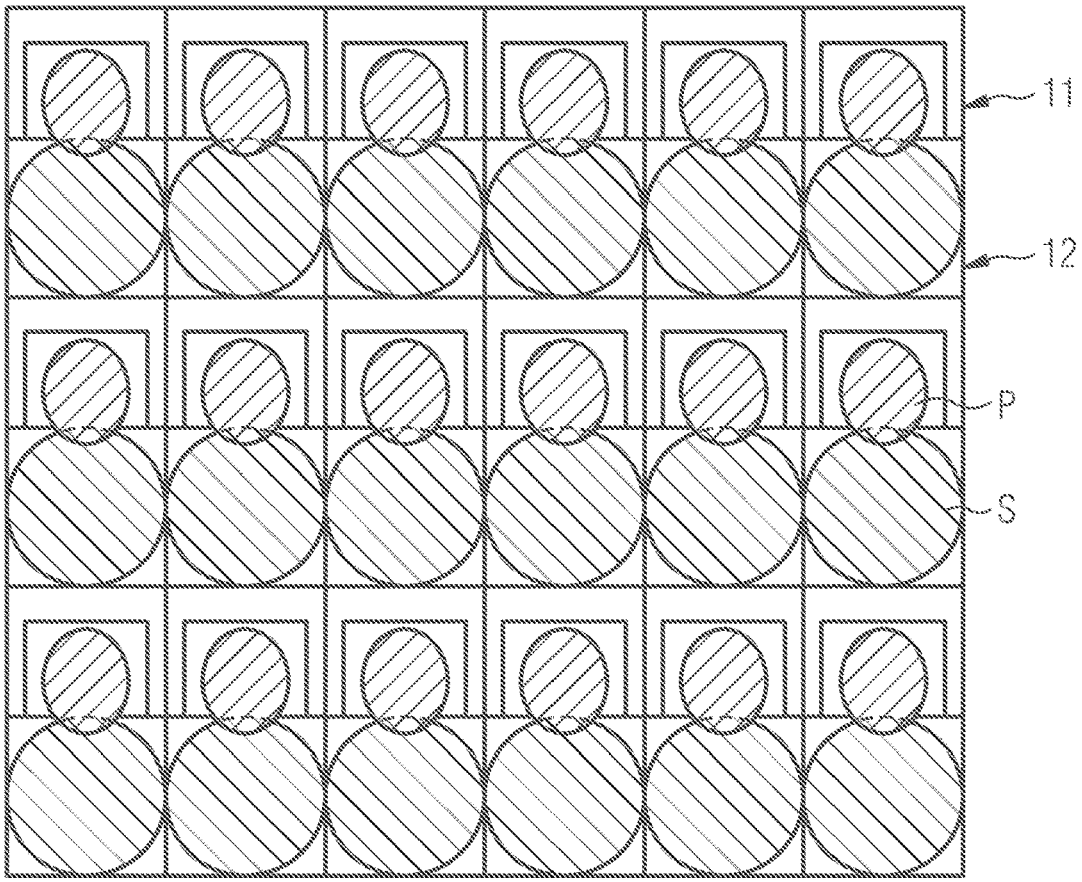

FIG. 26 illustrates that the primary light sources 11 and the secondary light sources 12 are bijectively assigned and are arranged in a regular field. The primary light sources 11 are preferably controlled independently of each other, but they can also be electrically composited, for example by lines, columns or all together.

Figure 27:
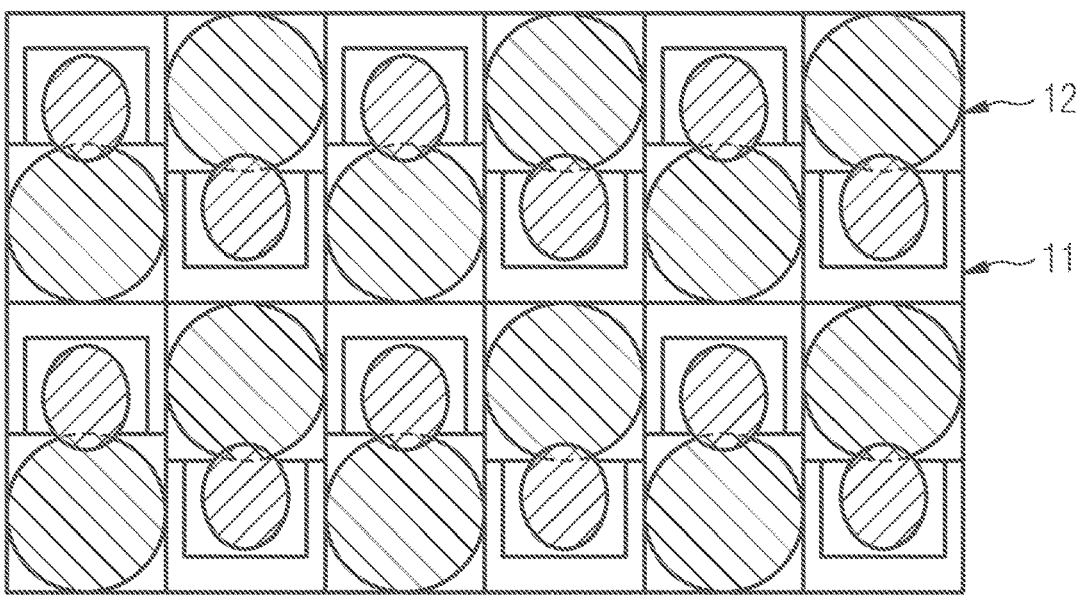

According to FIG. 26, the primary light sources 11 and the secondary light sources 12 are each present in separate lines. Such an arrangement is not absolutely necessary, see FIG. 27. Thus, the primary light sources 11 and the secondary light sources 12 can alternate along the rows and/or the columns.

As in the other exemplary embodiments shown so far, it is not necessary that the secondary light source 12 emits visible light. Thus, the secondary radiation S can be in the infrared or near-infrared range, e.g. in order to realize a large-area infrared illumination for surveillance applications.

Figure 28:
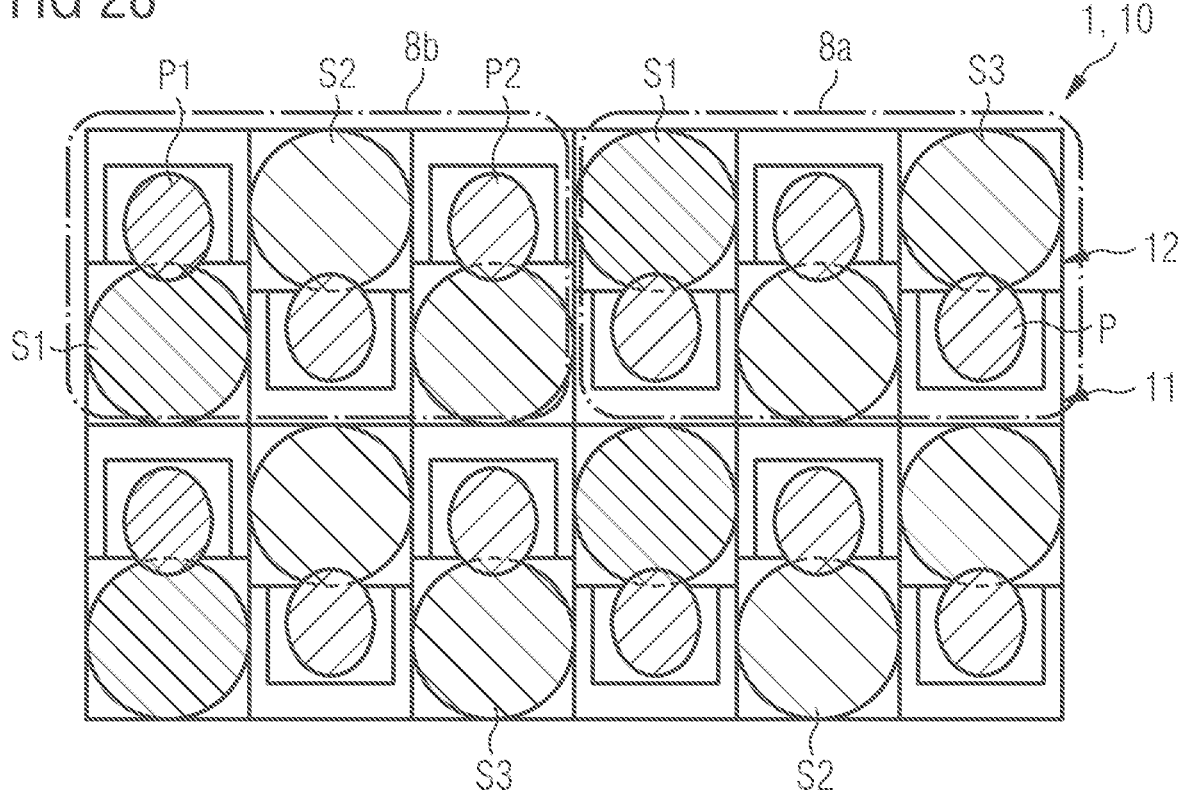
Figure 29:
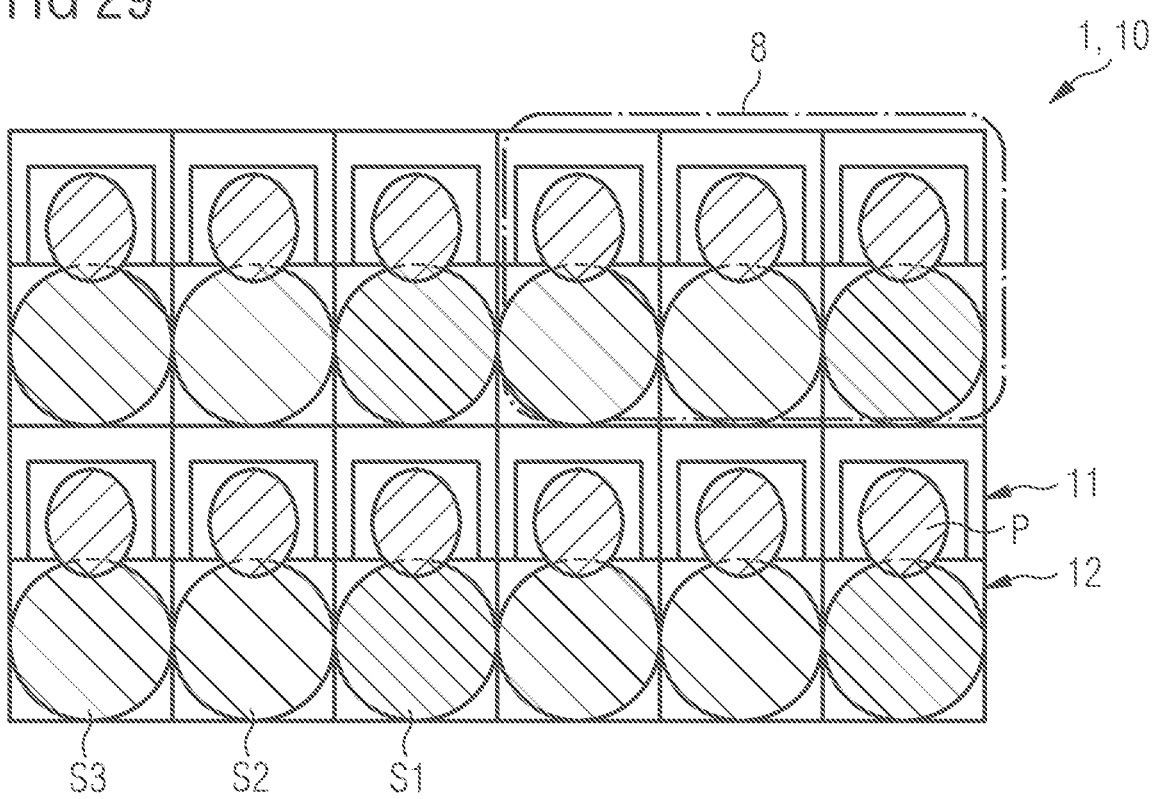

FIGS. 28 and 29 illustrate that the semiconductor component 1 is designed as display device 10. For this purpose, for example, three of the primary light sources 11 and three of the secondary light sources 12 are grouped to form a pixel 8. The pixels 8 are preferably RGB pixels for emission of red, green and blue light. The primary light sources 11 are preferably electrically independently controllable.

FIG. 28 shows that for a pixel 8a the primary radiation P is in the deep blue or near-ultraviolet spectral range. Thus, the secondary light sources emit 12 secondary radiations S1, S2, S3 in the blue, green and red spectral range. The associated pump media 4 of the secondary light sources are, for example, each formed by a phosphor, which can be attached to the associated primary light source 11 via dispensing or printing.

In contrast, another pixel 8b is illustrated, where two types of primary light sources 11 are present, which generate pump laser radiation P1, P2. The pump laser radiation P2 is in the blue or near-ultraviolet spectral range, so that the longer-wave secondary radiation S2, S3 can be generated in the green and red spectral range. The secondary radiation S1 is optional and can be directly replaced by the pump laser radiation P1. Alternatively, the secondary radiation S1 is merely scattered pump laser radiation P1, so that there is no pump medium for blue light, but for example only a scattering medium.

Both concepts, i.e. the generation of red, green and blue light by the pump media 4 or the use of blue light directly from the primary light source 11, can also be used in other arrangements, see for example the linear arrangement in FIG. 29.

In FIGS. 26 to 29, the secondary light sources 12 are all shown in the same size, as are the primary light sources 11. This is not always necessary. The sizes of the pump media 4, as well as the modes of the radiation P, S, can be adapted to the respective requirements, for example to produce a larger amount of green light. Likewise, it is not necessary that the pixels 8 are formed by three primary light sources 11 and three secondary light sources 12; numbers may also differ.

Figure 30:
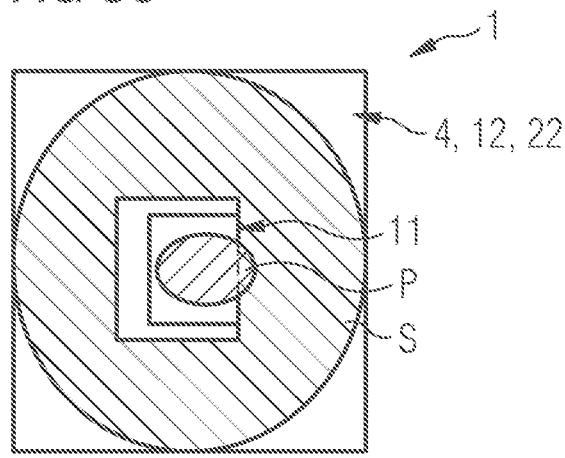

FIG. 30 illustrates that the primary light source 11 is integrated into the secondary light source 12 when viewed in plan view. Thus, the resonator axes 51, 52 can run parallel to each other, as shown in the sectional views of FIGS. 31 and 32. Along the resonator axes 51, 52, the primary light source 11 can run completely through the pump medium 4, see FIG. 32, or it can extend only partially along the second resonator axis 52, see FIG. 31.

Figure 33:
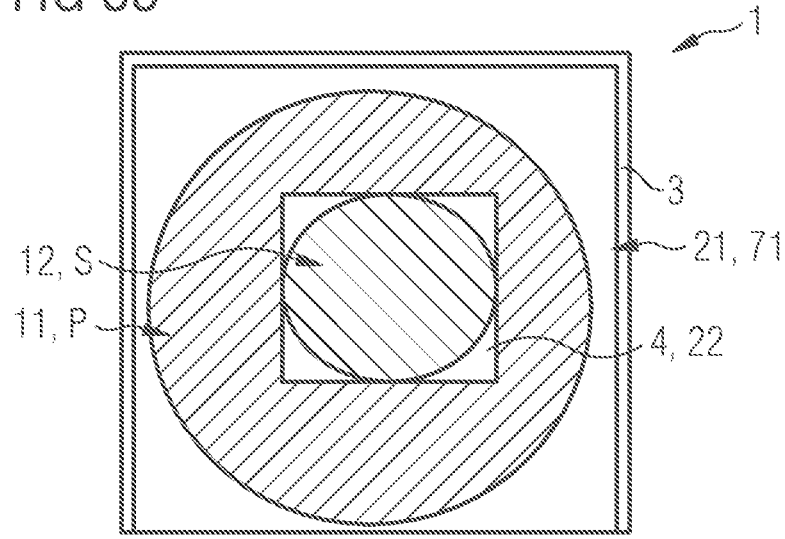
FIG. 33 shows a schematic plan view of an exemplary embodiment of an optoelectronic semiconductor component described here.

FIG. 33 illustrates the opposite case, where the secondary light source 12 is placed inside the primary light source 11.

Figure 31:
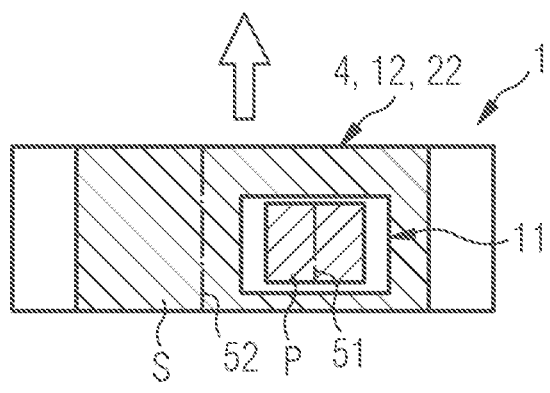
FIGS. 31 and 32 show schematic sectional views of the exemplary embodiment of FIG. 30.
Figure 32:
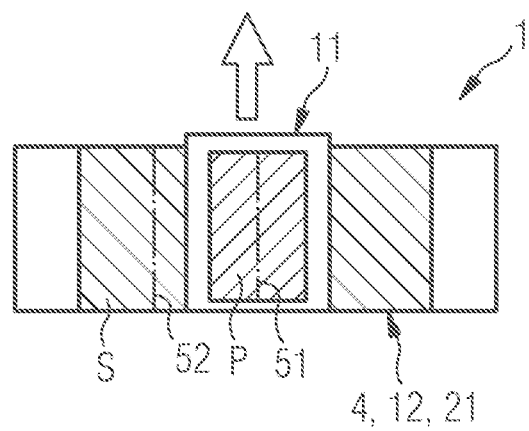

The statements given in context of FIGS. 30 to 32 apply to FIG. 33 accordingly.

FIGS. 34 and 35 illustrate that the pump medium 4 can serve as a growth substrate 64 of the primary light source 11. The growth substrate 64 is, for example, made of GaN, SiC or sapphire and preferably provided with a dopant such as Ce, Cr, Er, Nb, Ti, Pr and/or Yb. The dopant is optically excited by the pump laser radiation P and thus serves itself as laser medium or as luminescence medium. Thus a substrate mode can serve as a pump mode.

For example, a blue, green and/or petrol emitting VCSEL is grown as a primary light source 11 on a titan-doped sapphire substrate. The VCSEL structure can thus be applied or grown on the optically active substrate 64. Again, an optically active material such as the substrate material or another material can be deposited over the VCSEL structure of the primary light source 11. A mirror coating of the primary light source 11 has to be adapted accordingly, so that an efficient lateral coupling to the growth substrate 64 and thus to the pump medium 4 is given.

FIG. 34 shows that the growth substrate 64 protrudes laterally beyond the primary light source 11. For each primary light source 11 there may be a recess in the growth substrate 64.

Preferably, the growth substrate 64 is provided with a coating layer in places, analogous to FIG. 12. Such a coating layer is not shown in FIGS. 34 and 35.

In the exemplary embodiment in FIG. 36, a recess with side walls 91 is formed in the semiconductor layer sequence 3. The side walls 91 are preferably arranged diagonally, so that the recess can be shaped like a truncated pyramid or a truncated cone. Deviating from the illustration in FIG. 36, the recess can also end within the semiconductor layer sequence 3, so that the recess does not completely pass through the semiconductor layer sequence 3, but is a blind hole.

The pump medium 4 is preferably filled into the recess afterwards and may contain quantum dots, phosphors or similar. A corresponding pump medium 4 can be generated by means of vapor deposition, sputtering or epitaxial growth.

A reverse manufacturing process is also possible, where first the pump medium 4 is produced and then, for example, the semiconductor layer sequence 3 is epitaxially deposited around the pump medium 4. The same applies to all other exemplary embodiments.

Arrays, as shown in particular in FIGS. 26 to 29, can be generated by arranging the primary light sources and/or the secondary light sources closely adjacent to each other via a transfer process, for example a targeted removal from a growth substrate. Gaps between adjacent light sources 11, 12 can then be filled with a material, for example spin-on glass or a plastic with a preferably high refractive index.

Such arrays of light sources 11, 12, see especially FIGS. 26 to 29, can also be produced by selective epitaxial growth directly adjacent to each other.

As in all other exemplary embodiments, the pump medium 4, which is filled into the recess of the semiconductor layer sequence 3, can be a quantum dot matrix or a doped solid state laser crystal such as Nd:YAG or Ti:Sapphire.

Furthermore, edge-emitting semiconductor laser structures can be used or nanorods, also in a so-called nanorod-wispering gallery laser arrangement.

FIG. 37 shows an example of the semiconductor layer sequence 3 for a primary light source 11. Between a first region 31 and a second region 32 of the semiconductor layer sequence 3 there is an active zone 33 for the generation of the pump laser radiation P. The resonator mirrors 71 can simultaneously serve as electrodes 35, so that the electrodes 35 are deposited over the entire surface. The semiconductor layer sequence 3 is based, for example, on the material system AlInGaN, AlInGaAs or AlInGaAlP, as is also possible in all other exemplary embodiments.

Optionally, a current aperture 34 is located in the semiconductor layer sequence 3, for example close to or directly at the active zone 33. The current aperture 34 is made of a semiconductor material or also of a metal. In a region where the current aperture 34 is present, there is preferably no current flow through the semiconductor layer sequence 3. Thus, a limitation of the current flow can be achieved via the current aperture 34 and a form of the mode of the pump laser radiation P can be defined.

FIG. 38 illustrates that in the semiconductor layer sequence 3 along the first resonator axis 51 for example two maxima of an intensity I can be formed. Especially in the case of geometries in which the resonator axes 51, 52 are arranged perpendicular to each other, see for example FIGS. 3 and 4, the pump medium 4 is arranged in one of the maxima. In particular, the pump medium 4 is located in the maximum where the maximum assigned to the active zone 33 is not located.

An extension of the semiconductor layer sequence 3 along the first resonator axis 51 is preferably small and is, for example, at most 5 μm or 3 μm. Thus, it is possible that only a few intensity maxima are formed.

FIG. 39 shows an example of a geometry for the current aperture 34. In the direction towards the secondary light source 12, the current aperture 34 is not present or, in order to prevent current flow at least close to a facet or outer boundary surface of the primary light source 11, it is only very narrowly designed.

It is not necessary that the opening in the current aperture 34 is circular, because the pump laser radiation P is not emitted out of the semiconductor component 1 and thus a beam profile of the pump laser radiation P is not necessarily essential for the beam profile of the secondary radiation S.

Unless otherwise indicated, the components shown in the figures preferably follow each other directly in the order given. Layers not touching each other in the figures are preferably spaced apart. If lines are drawn parallel to each other, the corresponding surfaces are preferably aligned parallel to each other. Likewise, unless otherwise indicated, the relative positions of the drawn components to each other are correctly shown in the figures.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

REFERENCES

1 optoelectronic semiconductor component
11 primary light source
12 secondary light source
21 first resonator
22 second resonator
23 resonator end surface
3 semiconductor layer sequence
31 first region of the semiconductor layer sequence
32 second region of the semiconductor layer sequence
33 active Zone
34 current aperture
35 electrode
4 pump medium
51 first resonator axis of the first resonator
52 second resonator axis of the second resonator
61 connection layer
62 coating layer
64 growth substrate
65 dichroic coating
71 resonator mirror of the first resonator
72 resonator mirror of the second resonator
73 outcoupling coating
8 pixel
9 filling
91 side wall
10 display device
G growth direction
L wavelength in nm
P pump laser radiation
S secondary radiation

The invention claimed is:

1. An optoelectronic semiconductor component comprising a primary light source and a secondary light source, wherein
the primary light source and the secondary light source are monolithically integrated in the semiconductor component so that there is exclusively condensed matter between them so that there is neither an air gap nor a free beam path between the primary light source and the secondary light source;
the primary light source comprises a first resonator which contains a semiconductor layer sequence which is electrically pumped during operation;
a first resonator axis of the first resonator is oriented parallel to a growth direction of the semiconductor layer sequence;
the primary light source is configured to generate a pump laser radiation;
the secondary light source comprises at least one pump medium for generating a secondary radiation and the pump medium is optically pumped by the pump laser radiation; and
the first resonator axis points past the pump medium.

2. The optoelectronic semiconductor component according to claim 1,
in which the pump laser radiation is guided only along the resonator axis and resonator end surfaces of the first resonator are opaque to the pump laser radiation,
wherein the optical pumping of the pump medium is performed in a direction perpendicular to the first resonator axis by means of an evanescent field of the pump laser radiation, and
wherein the pump laser radiation does substantially not leave the semiconductor component.

3. The optoelectronic semiconductor component according to claim 1,
in which the secondary light source comprises a second resonator in which the pump medium is located,
wherein the secondary radiation is a laser radiation, and
wherein a laser mode of the pump laser radiation overlaps with a laser mode of the secondary radiation.

4. The optoelectronic semiconductor component according to claim 3,
in which the second resonator comprises a second resonator axis which is aligned parallel to the first resonator axis with a tolerance of at most 10°.

5. The optoelectronic semiconductor component according to claim 4,
in which the first resonator and the second resonator are jointly bounded by at least one Bragg mirror along the first and second resonator axes,
wherein the at least one Bragg mirror is highly reflective for the pump laser radiation and transmissive for the secondary radiation.

6. The optoelectronic semiconductor component according to claim 5,
in which the at least one Bragg mirror at at least one resonator end is the only resonator end mirror for both resonators.

7. The optoelectronic semiconductor component according to claim 3,
in which the second resonator comprises a second resonator axis which is aligned perpendicular to the first resonator axis with a tolerance of at most 30°,
wherein the secondary light source is designed as an edge-emitting laser.

8. The optoelectronic semiconductor component according to claim 7,
in which the pump medium is arranged in an intensity maximum of the pump laser radiation along the first resonator axis.

9. The optoelectronic semiconductor component according to claim 1,
in which the first resonator surrounds the pump medium on at least two sides, seen in plan view of the first resonator parallel to the first resonator axis.

10. The optoelectronic semiconductor component according to claim 9,
in which the pump medium is surrounded all around by the first resonator when viewed in plan view parallel to the first resonator axis.

11. The optoelectronic semiconductor component according to claim 1,
in which for the pump laser radiation a refractive index of the pump medium is at least as large as a refractive index of the semiconductor layer sequence.

12. The optoelectronic semiconductor component according to claim 1,
in which a connection layer is located between the primary light source and the secondary light source,
wherein the connection layer has a lower reflectivity for the pump laser radiation than for the secondary radiation and/or the connection layer divides a refractive index jump between the first resonator and the pump medium into two smaller refractive index jumps.

13. The optoelectronic semiconductor component according to claim 1,
in which the pump medium is provided with a coating layer reflecting the pump laser radiation and/or the secondary radiation on all sides facing away from the primary light source in a direction transverse to a main emission direction of the secondary radiation.

14. The optoelectronic semiconductor component according to claim 1,
comprising a plurality of said primary light sources configured for common optical pumping of said secondary light source.

15. The optoelectronic semiconductor component according to claim 14,
in which the primary light sources are stacked on top of each other,
wherein the primary light sources are optically decoupled from each other in a direction parallel to the first resonator axes.

16. The optoelectronic semiconductor component according to claim 1,
comprising a plurality of said secondary light sources which are commonly optically pumped by the one or from one of said primary light sources during operation.

17. The optoelectronic semiconductor component according to claim 1,
in which the pump medium is partially or completely integrated in a growth substrate of the semiconductor layer sequence.

18. An optoelectronic semiconductor component comprising a primary light source and a secondary light source, wherein
the primary light source and the secondary light source are monolithically integrated in the semiconductor component so that there is exclusively condensed matter between them so that there is neither an air gap nor a free beam path between the primary light source and the secondary light source;
the primary light source comprises a first resonator which contains a semiconductor layer sequence which is electrically pumped during operation;
a first resonator axis of the first resonator is oriented parallel to a growth direction of the semiconductor layer sequence;
the primary light source is configured to generate a pump laser radiation;
the secondary light source comprises at least one pump medium for generating a secondary radiation and the pump medium is optically pumped by the pump laser radiation;
the first resonator axis points past the pump medium; and
the pump laser radiation is guided only along the resonator axis and resonator end surfaces of the first resonator are opaque to the pump laser radiation.

19. An optoelectronic semiconductor component comprising:
a primary light source and a secondary light source, wherein
the primary light source and the secondary light source are monolithically integrated in the semiconductor component so that there is exclusively condensed matter between them,
the primary light source comprises a first resonator which contains a semiconductor layer sequence which is electrically pumped during operation,
a first resonator axis of the first resonator is oriented parallel to a growth direction of the semiconductor layer sequence,
the primary light source is configured to generate a pump laser radiation,
the secondary light source comprises at least one pump medium for generating a secondary radiation and the pump medium is optically pumped by the pump laser radiation, and
the first resonator axis points past the pump medium; and
a plurality of said primary light sources and a plurality of said secondary light sources, wherein
the primary light sources or groups of primary light sources are electrically independently controllable,
between the primary light sources and the secondary light sources there is a bijective assignment, and
the primary light sources and the secondary light sources are arranged in a regular field seen in plan view.

20. The optoelectronic semiconductor component according to claim 19,
which is a display device and which is configured to emit red, green and blue light in pixels independently of each other, wherein at least the red and the green light is generated by the secondary light sources.

\* \* \* \* \*